(12) United States Patent
Miao et al.

(10) Patent No.: US 10,568,205 B2
(45) Date of Patent: Feb. 18, 2020

(54) CERAMIC AND POLYMER COMPOSITE, AND USES THEREOF

(71) Applicant: Corning Incorporated, Corning, NY (US)

(72) Inventors: Weiguo Miao, Horseheads, NY (US); Manuela Ocampo, Corning, NY (US); Michael Lesley Sorensen, Waverly, NY (US); James William Zimmermann, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/656,657

(22) Filed: Jul. 21, 2017

(65) Prior Publication Data

US 2018/0035538 A1    Feb. 1, 2018

Related U.S. Application Data

(60) Provisional application No. 62/367,301, filed on Jul. 27, 2016.

(51) Int. Cl.
| | |
|---|---|
| *H05K 1/00* | (2006.01) |
| *H05K 1/02* | (2006.01) |
| *H05K 1/03* | (2006.01) |
| *C04B 35/117* | (2006.01) |
| *C04B 41/48* | (2006.01) |
| *C08K 3/22* | (2006.01) |
| *H05K 3/00* | (2006.01) |

(52) U.S. Cl.
CPC ............. *H05K 1/0306* (2013.01); *C08K 3/22* (2013.01); *H05K 3/0011* (2013.01); *C08K 2003/2227* (2013.01); *H05K 3/0047* (2013.01); *H05K 2201/0116* (2013.01); *H05K 2201/0154* (2013.01); *H05K 2201/0175* (2013.01)

(58) Field of Classification Search
CPC ........... Y10T 428/249956; Y10T 428/249991; H05K 1/0306; H05K 1/0313; H05K 2201/0116; H05K 2201/0175; C04B 35/117; C04B 41/48; C04B 41/83
See application file for complete search history.

(56) References Cited

U.S. PATENT DOCUMENTS

| | | | |
|---|---|---|---|
| 2,089,444 A | 8/1937 | Staudinger et al. | |
| 4,134,848 A | 1/1979 | Adicoff et al. | |
| 4,661,301 A | 4/1987 | Okada et al. | |
| 4,882,455 A | 11/1989 | Sato et al. | |
| 4,994,316 A | 2/1991 | Browne et al. | |
| 5,144,536 A * | 9/1992 | Tsukada | ............. H01L 21/4807 |
| | | | 174/258 |
| 5,886,134 A | 3/1999 | Wang et al. | |
| 5,925,451 A * | 7/1999 | Ohya | .................... C04B 35/803 |
| | | | 264/628 |
| 6,110,577 A | 8/2000 | Ishikawa et al. | |
| 6,509,414 B2 | 1/2003 | Tikart et al. | |
| 6,528,145 B1 | 3/2003 | Berger et al. | |
| 6,594,892 B2 * | 7/2003 | Ohya | ................... H05K 3/0011 |
| | | | 29/846 |
| 6,953,539 B2 | 10/2005 | Ishikawa et al. | |
| 7,807,227 B2 | 10/2010 | Aechtner et al. | |
| 7,885,079 B2 | 2/2011 | Chen et al. | |
| 7,924,392 B2 | 4/2011 | Yamazaki et al. | |
| 8,022,140 B2 | 9/2011 | Tikart et al. | |
| 8,507,578 B2 | 8/2013 | Sadoun | |
| 9,287,106 B1 | 3/2016 | Mia et al. | |
| 2004/0173891 A1 * | 9/2004 | Imai | .................. H01L 23/49827 |
| | | | 257/686 |
| 2010/0224396 A1 * | 9/2010 | Nomiya | ............... H05K 3/4629 |
| | | | 174/258 |
| 2013/0220676 A1 | 8/2013 | Kawaguchi et al. | |
| 2013/0330394 A1 | 12/2013 | Ponticiello et al. | |
| 2016/0002117 A1 | 1/2016 | Badding et al. | |

FOREIGN PATENT DOCUMENTS

| | | | |
|---|---|---|---|
| CN | 102468183 A | | 5/2012 |
| CN | 102468296 A | | 5/2012 |
| EP | 0196865 A2 | | 10/1986 |
| EP | 0512401 A2 | | 11/1992 |
| EP | 3035778 A1 | | 6/2016 |
| KR | 824679 B1 | | 4/2008 |
| TW | 200822831 A | | 5/2008 |
| WO | 2011005535 A1 | | 1/2011 |
| WO | 2013178852 A1 | | 12/2013 |
| WO | 2015013129 A1 | | 1/2015 |

OTHER PUBLICATIONS

Ahmed, "Polymeric Dielectric Materials" Chapter One of Dielectric Material, Published by Intech, 2012. 25 pgs. http://dx.doi.org/10.5772/50638.

Sharma et al. "Laminate materials with low dielectric properties" Presented at IPC Printed Circuit Expo 2002, 8 pgs.

Von Hippel et al. "Polystyrene plastics as high frequency dielectrics" Industrial and Engineering Chemistry (38) pp. 1121-1129, 1946.

International Search Report and Written Opinion PCT/US2017/043254 dated Oct. 27, 2017.

Kim et al. "Microstructure and mechanical properties of heterogeneous interpenetrating network" Journal of Nonmaterials, vol. 2012. 2012. pp. 1-6.

(Continued)

*Primary Examiner* — Joanna Pleszczynska

(57) ABSTRACT

A ceramic and polymer composite including: a first continuous phase comprising a sintered porous ceramic having a solid volume of from 50 to 85 vol % and a porosity or a porous void space of from 50 to 15 vol %, based on the total volume of the composite; and a second continuous polymer phase situated in the porous void space of the sintered porous ceramic. Also disclosed is a composite article, a method of making the composite, and a method of using the composite.

10 Claims, 3 Drawing Sheets

(56) References Cited

OTHER PUBLICATIONS

Tilbrook et al. "On the mechanical properties of alumina-epoxy composites with an interpenetrating network structure" Materials Science and Engineering: A, 393 (1-2) pp. 170-178.
Hwang et al. "Dielectric and thermal properties of dicyclopentadiene containing bismaleimide and cyanate ester. Part IV" Polymer 47 (2006) pp. 1291-1299.
Reed, "Chapter 26—Tape Casting" pp. 525-539, in Principles of Ceramic Proccessing, 1995 2nd ed. ISBN-13: 978-0471597216.

* cited by examiner

CERAMIC AND POLYMER COMPOSITE, AND USES THEREOF

This application claims the benefit of priority under 35 U.S.C. § 119 of U.S. Provisional Application Ser. No. 62/367,301 filed on Jul. 27, 2016 the content of which is relied upon and incorporated herein by reference in its entirety.

CROSS-REFERENCE TO RELATED APPLICATIONS

The present application is related to commonly owned and assigned U.S. Provisional Application Ser. No. 62/113,830, filed on Feb. 9, 2015, entitled "SPINEL SLURRY AND CASTING PROCESS," which mentions: a magnesium aluminate spinel nanopowder comprising: a particle size of from 200 to 800 nm; a median particle size of from 200 to 400 nm; and a surface area by BET is from 2 to 10 $m^2/g$, and a method of making the magnesium aluminate spinel nanopowder comprising: contacting an aqueous solution of $(NH_4)_2CO_3$ and an aqueous solution of a mixture of $(NH_4)Al(SO_4)_2$ and $Mg(NO_3)_2$ at about 45 to 55° C.; aging the reaction mixture at about 45 to 55° C. for 5 to 15 hrs while mixing to produce a solid; separating, washing, and drying, the resulting solid; and sintering the resulting solid at from 1300 to 1500° C. to form a spinel product; and 62/019,649, now US Pat Pub 20160002117, filed Jul. 1, 2014, entitled "TRANSPARENT SPINEL ARTICLE AND TAPE CAST METHODS FOR MAKING," which mentions: a transparent, tape casted, spinel article, comprising: at least one of: a single layer thickness of 10 to 300 micrometers, or a laminate comprising a plurality of laminated single layers, the laminate having a thickness of 50 micrometers to 10 millimeters; the spinel article having: a transparency of 80% to 87%; and a sintered grain size of from 1 to 7 micrometers, and also mentions: a method of making a tape casted, transparent spinel, comprising: attrition milling, for from 10 min to 10 hrs to form a slurry, a batch mixture comprising a spinel powder having a mean particle size of from 75 to 500 nanometers, a binder, a dispersant, a plasticizer, a defoaming agent, and an aqueous solvent; degassing the resulting isolated slurry under vacuum; tape casting the degassed slurry to a wet thickness of from 20 to 2,000 micrometers; controlled drying using an under-bed heater and heated flowing air at from 20 to 100° C. of the tape casted slurry to form a green tape having a dry thickness of from 5 to 1,000 micrometers; and firing the green tape for a sufficient time and temperature to provide a sintered transparent spine; and U.S. Pat. No. 9,287,106, issued Mar. 15, 2016, entitled "Translucent alumina filaments and tape cast methods for making," which mentions translucent alumina substrates, along with methods of making translucent alumina substrates via such methods as tape casting. The translucent alumina substrates have advantages over prior filaments due to their quality, including total transmittance, and surface qualities, along with the simplicity of making these materials via scalable processes, such as tape casting. The content of these documents and any of their patent publications is incorporated by reference but the present disclosure does not claim priority thereto.

The entire disclosure of any publication or patent document mentioned herein is incorporated by reference.

BACKGROUND

The disclosure relates to a composite of a ceramic and a polymer.

SUMMARY

In embodiments, the disclosure provides a co-continuous polymer-ceramic composite having improved resiliency and toughness compared to a corresponding monolithic ceramic only, i.e., the ceramic with or without pores, and without a co-continuous polymer.

In embodiments, the disclosure provides a method of making the disclosed co-continuous polymer-ceramic composite.

In embodiments, the disclosure provides a printed circuit board (PCB) article made from the disclosed co-continuous polymer-ceramic composite comprising a thin co-continuous polymer and ceramic composite.

DETAILED DESCRIPTION

Figure 1:
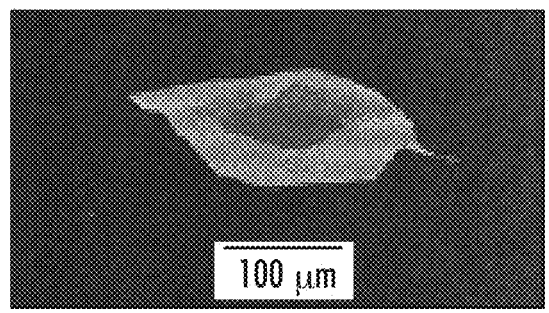
FIG. 1 shows an example of a disclosed ceramic-polymer composite that can be easily machined, which allows both mechanical and laser drilling of holes or vias.

Various embodiments of the disclosure will be described in detail with reference to drawings, if any. Reference to various embodiments does not limit the scope of the invention, which is limited only by the scope of the claims attached hereto. Additionally, any examples set forth in this specification are not limiting and merely set forth some of the many possible embodiments of the claimed invention.

In embodiments, the disclosed method of making and using provide one or more advantageous features or aspects, including for example as discussed below. Features or aspects recited in any of the claims are generally applicable to all facets of the invention. Any recited single or multiple feature or aspect in any one claim can be combined or permuted with any other recited feature or aspect in any other claim or claims.

Definitions

"Co-continuous," "bi-continuous," and like terms refer to a continuous or intra-connected disposition of each of the respective ceramic and polymer phases in the composite. Neither phase has any substantial discontinuities, i.e., there are no significant discontinuous or disconnected phases such as one or more isolated phase islands. There is a continuous or bi-phasic analogy in the emulsion or micro-emulsion arts, which are variously referred to as a bi-continuous emulsion, a multiple emulsion, or a complex emulsion.

"Polymer," "resin," and like terms refer to a main constituent of the liquid phase during infiltration and prior to curing, and can be, for example: a source for a solid polymer; a monomer; an oligomer; a polymer; a resin; a cross-linkable polymer; a cross-linker; or mixtures thereof "Polymer," "resin," and like terms can also refer to a main constituent of the solid polymer phase after curing and is preferably free of liquid constituents used during infiltration, such as free of: liquid polymer; liquid resin; liquid monomer; liquid cross-linker; liquid solvent; liquid carrier; and like constituents.

"Bisque firing" and like terms refer to a ceramic ware that is fired to form some sintering between adjacent particles but has or retains voids or pores between the particles where the sintering has not occurred and creates an interconnected skeleton of the particles in the fired tape.

"FR-4", "FR4", "FR", "FR408HR", "flame retardant", is a grade designation assigned to glass-reinforced epoxy laminate sheets, tubes, rods and printed circuit boards (PCB). FR-4 is a composite material composed of woven fiberglass cloth with an epoxy resin binder that is flame resistant (i.e., self-extinguishing). FR-4 is comprised of an epoxy resin, woven glass fabric reinforcement, brominated flame retardant, and other components.

"Dielectric loss" and like terms refer to a dissipation factor (Df) or a loss tangent that quantifies a dielectric material's inherent dissipation of electromagnetic energy, such as heat.

"Include," "includes," or like terms means encompassing but not limited to, that is, inclusive and not exclusive.

"About" modifying, for example, the quantity of an ingredient in a composition, concentrations, volumes, process temperature, process time, yields, flow rates, pressures, viscosities, and like values, and ranges thereof, or a dimension of a component, and like values, and ranges thereof, employed in describing the embodiments of the disclosure, refers to variation in the numerical quantity that can occur, for example: through typical measuring and handling procedures used for preparing materials, compositions, composites, concentrates, component parts, articles of manufacture, or use formulations; through inadvertent error in these procedures; through differences in the manufacture, source, or purity of starting materials or ingredients used to carry out the methods; and like considerations. The term "about" also encompasses amounts that differ due to aging of a composition or formulation with a particular initial concentration or mixture, and amounts that differ due to mixing or processing a composition or formulation with a particular initial concentration or mixture.

"Optional" or "optionally" means that the subsequently described event or circumstance can or cannot occur, and that the description includes instances where the event or circumstance occurs and instances where it does not.

The indefinite article "a" or "an" and its corresponding definite article "the" as used herein means at least one, or one or more, unless specified otherwise.

Abbreviations, which are well known to one of ordinary skill in the art, may be used (e.g., "h" or "hrs" for hour or hours, "g" or "gm" for gram(s), "mL" for milliliters, and "rt" for room temperature, "nm" for nanometers, and like abbreviations).

Specific and preferred values disclosed for components, ingredients, additives, dimensions, conditions, times, and like aspects, and ranges thereof, are for illustration only; they do not exclude other defined values or other values within defined ranges. The composition and methods of the disclosure can include any value or any combination of the values, specific values, more specific values, and preferred values described herein, including explicit or implicit intermediate values and ranges.

Existing printed circuit boards (PCB) are made from polymers and polymer/glass fiber composites. Current PCBs are constructed on polymer sheets that often do not have the thermal stability necessary to offer a decent useful life. It is desirable to develop a more durable PCB option that can meet the low dielectric constant (Dk) and dissipation factor (DO demands of an evolving market. Ceramics tend to be brittle and a reduction to a thickness of 100 micrometers or less results in a material that has the tendency to fail during handling.

Existing printed circuit boards (PCBs) constructed using glass-reinforced laminate may not be suitable for high speed applications. For example, when a PCB with glass-reinforced laminate operates at a high frequency, significant parasitic capacitance and/or inductance may be incurred by transmission lines in the PCB, which can distort transmitted signals. Existing technologies attempt to improve the high speed performance of the PCB by reshaping the glass weave in the laminate.

Advancement in electronic packaging to reduce the packaged device thickness would be advantageous for future devices. Existing packaging material is 250 to 350 micrometers thick and the industry requires a thickness of 100 micrometers or less to achieve device thickness targets. Most incumbent materials (dominated by FR4 material) contain polymeric materials with woven glass fibers, while some incumbent materials are completely polymeric. As the device becomes thinner, the rigidity of the material becomes less resulting in dimensional instability and warping during soldering. The rigidity is the product of the Young's modulus and the area moment of the material (D), where in rectangular shapes the area moment is proportional to the cube of the thickness. To achieve equally ridged materials with thicknesses of 100 micrometer, the Young's modulus must be significantly greater than the Young's modulus of the existing material.

Ceramics are significantly stiffer than polymers. Aluminum oxide specifically has a Young's modulus of approximately 420 GPa. This value is significantly greater than FR4, which has a Young's modulus of 25 GPa. Simple calculation of a rigidity figure-of-merit, defined as E*t3, of the FR4 material at 250 micrometers is 375 N*mm. Aluminum oxide has a much greater rigidity with a figure-of-merit value of 6560 N*mm at 250 micrometers. Aluminum oxide can be reduced to 96 micrometers to have similar rigidity to the current FR4 material at 250 micrometers. The higher rigidity is not limited to aluminum oxide, and most ceramic materials have much greater rigidity than FR4 with equivalent thickness.

Stiffness is not the only parameter that drives dimensional stability. Thermal expansion mismatch with components on the circuit board is also important. Most of the components are composed of silicon or silicon carbide, which have thermal expansion coefficients of $2.6 \times 10^{-6}$ and $2.8 \times 10^{-6}$ $K^{-1}$ respectively. The FR4 material has a planer thermal expansion coefficient of $13 \times 10^{-6}$ $K^{-1}$, approximately 4 times greater than silicon and silicon carbide. Furthermore, the thickness thermal expansion coefficient is $70 \times 10^{-6}$ $K^{-1}$ which results in an increase propensity of warping. Polycrystalline ceramics tend to have isotropic thermal expansion values that are less than FR4 material in the planer direction. Aluminum oxide has a thermal expansion of $7.5 \times 10^{-6}$ $K^{-1}$, approximately 2.5 times higher than silicon and silicon carbide, but lower than FR4. The disclosed composite comprising, consisting essentially of, or consisting of, a polymer filled porous aluminum oxide is expected to have greater dimensional stability compared to a comparable FR4 material because of an increased stiffness and a reduced thermal expansion mismatch to on-board components. The dimensional stability or further reduction of the thickness can be achieved using other ceramics with equal or greater stiffness and better thermal expansion match with the on-board components.

Ceramics tend to be brittle and a reduction of thickness to 100 micrometers or less result in a material that has the tendency to fail during handling. The disclosed co-continuous, polymer-ceramic composites have been demonstrated to have improved resiliency and toughness compared to monolithic ceramics. Within the disclosed composite material, the ceramic forms a stiff interconnected skeleton, while the polymer forms a crack arresting media limiting the damage to localized regions. Since the ceramic requires interconnected porosity, the Young's modulus is lower than the Young's modulus of a fully dense ceramic. The inclusion of the polymeric phase also increases the thermal expansion slightly, resulting in a material that has lower rigidity and lower dimensional stability compared to the ceramic alone, but has the mechanical durability required for a variety of uses.

WO 2011/005535A1 mentions a composite having co-continuous ceramic and polymer phases, the ceramic phase having an interconnected network of pores and an interconnected network of truss-like structures, the truss-like structures having one or more triangular shapes, and the ceramic selected from the group of acicular mullite, alumina, and mixtures thereof, the polymer phase integrated within the ceramic phase, wherein the polymer phase is contained within the pores of the ceramic phase, the polymer phase selected from the group of a thermoplastic, a thermoset, and mixtures thereof.

In embodiments, the present disclosure provides a ceramic and polymer composite comprising:

a first continuous phase comprising a sintered porous ceramic having a solid volume of from 50 to 85 vol %, e.g., 50 to 80 vol %, 50 to 70 vol %, 50 to 60 vol %, including intermediate values and ranges, and a porosity of from 50 to 15 vol %, e.g., 50 to 20 vol %, 50 to 30 vol %, 45 to 35 vol %, 45 to 40 vol %, including intermediate values and range, based on the total volume of the composite; and a second continuous polymer phase within or situated in the void space, i.e., the porosity or the pores, of the sintered porous ceramic first continuous phase.

In embodiments, the sintered porous ceramic can comprise, for example, at least one of aluminum oxide, silicon oxide, and like oxides, or mixtures thereof.

In embodiments, the composite can be, for example, a sheet having, for example, a thickness of from 10 to 1000 micrometers.

In embodiments, the composite can be, for example, a sheet having a thickness of from 10 to 250 micrometers.

In embodiments, the composite can be, for example, a sheet having a thickness of from 10 to 100 micrometers.

In embodiments, the composite can have a strength of, for example, from 125 and 250 MPa (e.g., 125 and 150 MPa), and a Young's modulus of from 50 and 250 GPa (e.g., 50 and 65 MPa).

In embodiments, the Young's modulus of the sintered porous ceramic continuous phase can be, for example, from 50 to 210 GPa (e.g., 65 and 150 MPa) and is less than the Young's modulus of a fully dense ceramic (e.g., about 410 GPa).

In embodiments, the composite can have a stiffness, for example, of from 50 to 65 GPa (e.g., 55 to 60 GPa).

In embodiments, the composite can have a coefficient of thermal expansion (CTE) of from $11 \times 10^{-6}$ K$^{\circ -1}$ to $25 \times 10^{-6}$ K$^{\circ -1}$ in each of the x, y, and z axes (i.e., isotropic CTE, e.g., $11 \times 10^{-5}$ K$^{\circ -1}$ estimated).

In embodiments, the sintered porous ceramic continuous phase has an "overlapping sphere structure" comprised of a plurality of partially fused adjacent spherical ceramic particles of at least one of aluminum oxide, silicon oxide, and like oxides, or mixtures thereof.

In embodiments, the composite is co-continuous or bi-continuous.

In embodiments, the sintered porous ceramic first continuous phase can be, for example, a non-woven (see for example, the above patent application WO 2011/005535A1 to Dow Chemical).

In embodiments, the disclosure provides a method of making the abovementioned co-continuous ceramic and polymer composite comprising:

contacting the surface of a porous ceramic sheet and a curable polymer (i.e., infiltrating or imbibing, the pores of porous ceramic sheet), where the porous ceramic sheet has a volume percent of open pores or porosity of 15 to 50 vol %, including intermediate values and ranges.

In embodiments, the method of making can further comprise:

forming a porous sintered ceramic sheet having from 15 to 50 volume percent open pores or porosity, by at least one of tape casting, flame hydrolyzing, firing a green body ceramic having a pore former present in from 15 to 50 vol % and like methods, or a combination thereof.

In embodiments, the disclosure provides a method of making the abovementioned co-continuous ceramic and polymer composite comprising:

tape casting a ceramic slurry to form a ceramic green tape;
firing the green tape;
impregnating the fired tape with a curable polymer; and
curing the impregnated polymer in the fired tape to form the co-continuous polymer-ceramic composite.

In embodiments, firing the green tape comprises bisque firing at from 1000 to 1600° C. (i.e., a ceramic ware that is fired to a form), sintering, e.g., from 20 to 70 vol %, between adjacent particles but has voids or pores between the particles where sintering has not occurred to create an interconnected network between the particles and an interconnected network between the porous voids in the tape. In embodiments, the starting powders can be heated, for example, to 1000 to 1300° C. However, if larger particles are used, higher temperatures can be used.

In embodiments, the median particle size of inorganic particles in the ceramic slurry can be, for example, from 0.1 to 20 micrometers (e.g., 0.2 to 10 micrometers, such as 0.33 micrometers) including intermediate values and ranges, with 90% of the particles being, for example, less than 0.72 micrometers.

In embodiments, the curable polymer can be, for example, a liquid or the curable polymer can be, for example, in a liquid carrier (such as a solvent or dispersant).

In embodiments, the curable polymer can be, for example: a crosslinkable polymer, a polymerizable and crosslinkable monomer, or a mixture thereof, and a crosslinker.

In embodiments, the curable polymer can be, for example, at least one of: an epoxy resin, an amine-epoxide resin, a phenolic resin (e.g., a functionalized Bisphenol compound, e.g., Bisphenols A, AP, AF, B, BF, C, E, F, G, M, S, P, PH, TMC, Z, e.g., ElanCast®; Bisphenol F, e.g., Epoxylite®; etc.), an isocyanate resin, an alkyd resin, an acrylate, a polystyrene, a polyimide, a polyamine, and like polymers or resins, or a mixture thereof.

In embodiments, the disclosure provides an article comprising the abovementioned ceramic and polymer composite.

In embodiments, the article can be, for example, a printed circuit board.

In embodiments, the printed circuit board can have, for example, a frequency dielectric of from 2.4 to 6.7 at 10 GHz (e.g., 2.5 at 10 GHz) and a frequency dielectric performance of from 0.0016 to 0.012 at 10 GHz (e.g., 0.013 at 10 GHz for a PACM GE22 polymer).

In embodiments, the article can be, for example, machinable, e.g., a mechanical or laser drill, saw, finisher, or polisher.

In embodiment, the disclosure provides a co-continuous polymer-ceramic composite.

In embodiment, the disclosure provides an article comprising the disclosed co-continuous polymer-ceramic composite.

In embodiment, the disclosure provides a printed circuit board (PCB) comprising the disclosed co-continuous polymer-ceramic composite.

In embodiment, the disclosure provides an integrated circuit board (ICB) comprising the disclosed co-continuous polymer-ceramic composite.

In embodiments, by selecting a different polymer or a different mixture of polymers, the dielectric and mechanical properties of the polymer and the composite as a whole can be systematically adjusted.

Referring to the figures, FIG. 1 shows an example of a disclosed co-continuous ceramic-polymer composite (i.e., polymer-infiltrated alumina) that can be easily machined, such as boring with a hand held drill, which allows both mechanical and laser drilling of holes or vias.

One disclosed sample that was machined was from Example 3, specifically a 55 vol % aluminum oxide infiltrated with 45 vol % Amicure PACM/Erisys GE22, a 2 part epoxy amine, then cured, see A1 from Table 1. Another sample that was successfully machined was composite A3 listed in Table 3.

In embodiments, the disclosed a machinable co-continuous polymer-ceramic composite can be, for example, drilled into and through with a rotating drill bit without breaking, cracking, or fragmenting into pieces (see FIG. 1). Within the composite material, the ceramic forms a stiff interconnected skeleton structure, and the polymer forms a crack arresting medium or filler that can limit the damage to localized regions. Since the ceramic has the requisite interconnected porosity, the Young's modulus of the porous ceramic is lower than the Young's modulus of a fully dense ceramic. The inclusion of the polymeric phase in the composite also increases the thermal expansion slightly, resulting in a material that has a lower rigidity and a lower dimensional stability compared to the ceramic alone, but the resulting composite material has the mechanical durability suitable for various applications including circuit boards.

Figure 2:
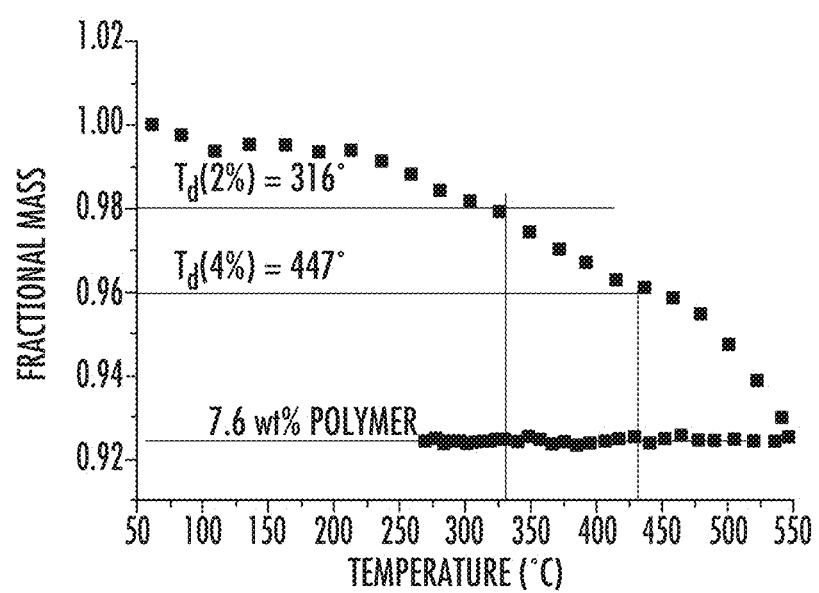
FIG. 2 shows a graph of thermal decomposition temperature ($T_d$) data obtained using thermo-gravimetric analysis (TGA) in $N_2$ for a disclosed infiltrated and cured composite material.

FIG. 2 shows a graph of thermal decomposition temperature ($T_d$) data obtained using thermo-gravimetric analysis (TGA) in $N_2$ for a disclosed infiltrated and cured composite material (see ASSOCIATION CONNECTING ELECTRONICS INDUSTRIES®, Decomposition Temperature ($T_d$) of Laminate Material Using TGA; Number 2.4.24.6, IPM-TM-650; ipc.org/4.0_Knowledge/4.1_Standards/test/2-4_2-4-24-6.pdf). The disclosed infiltrated and cured composite material was sample A3 listed in Table 3, which was an alumina fired at 1250° C. and then infiltrated with a curable Epoxylite 6107® resin and cured under nitrogen.

Figure 3:
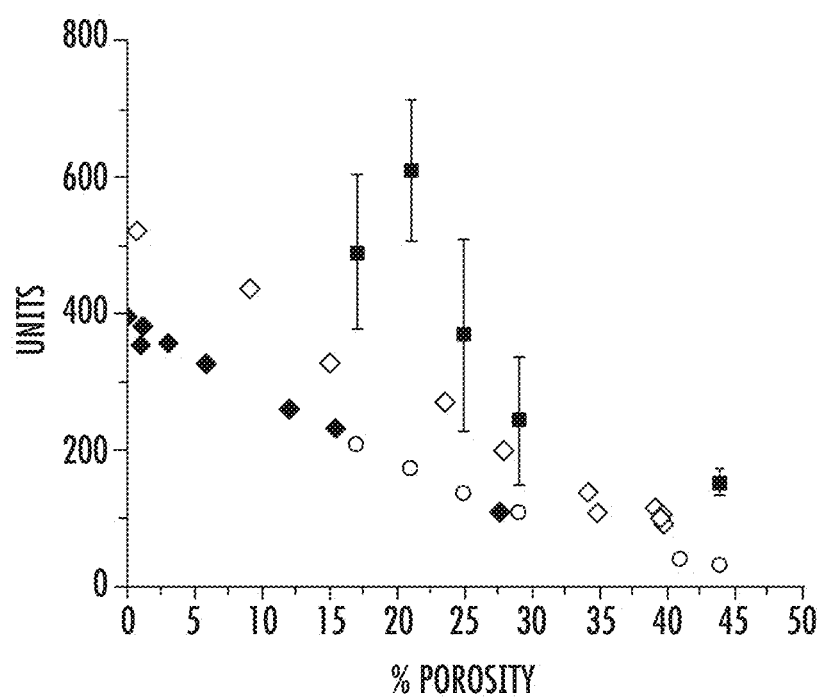
FIG. 3 shows a graph of porosity v. flexure strength (solid squares in MPa) and flexure modulus (open circles in GPa) for disclosed experimental composite samples A1 to A6 (Table 1) and a comparative composite.

FIG. 3 shows a graph of porosity v. flexure strength (solid squares in MPa) and flexure modulus (open circles in GPa) for disclosed experimental samples A1 to A6 (Table 1) and a control.

The data for composite samples A1 to A6 was plotted against comparative literature data, including Young's Modulus (solid diamonds in GPa) and flexure strength (open diamonds in MPa). The comparative controls were for reported alumina materials having varying amounts of porosity and obtained from the NIST database (NIST Reference: Database Reference: NIST Structural Ceramics Database, SRD Database Number 30, see online: srdata.nist.gov/CeramicDataPortal). The flexure strength was obtained using the three point bending method with the support span being 20 mm long and the loading span in the middle of the support span. The sample width was 10 mm and the sample thickness was as-fired, approximately 0.08 mm. The flexure modulus was obtained using dynamic mechanical analysis (DMA) using three point bending method with the support span being 10 mm long and the loading span in the middle of the support span. The sample width was 10 mm and the sample thickness was as-fired, approximately 0.08 mm. The storage modulus was defined as the flexure modulus. The results presented in FIG. 3 confirm that the disclosed co-continuous alumina-polymer composites that were selected and evaluated perform as expected compared to literature examples.

Figure 4:
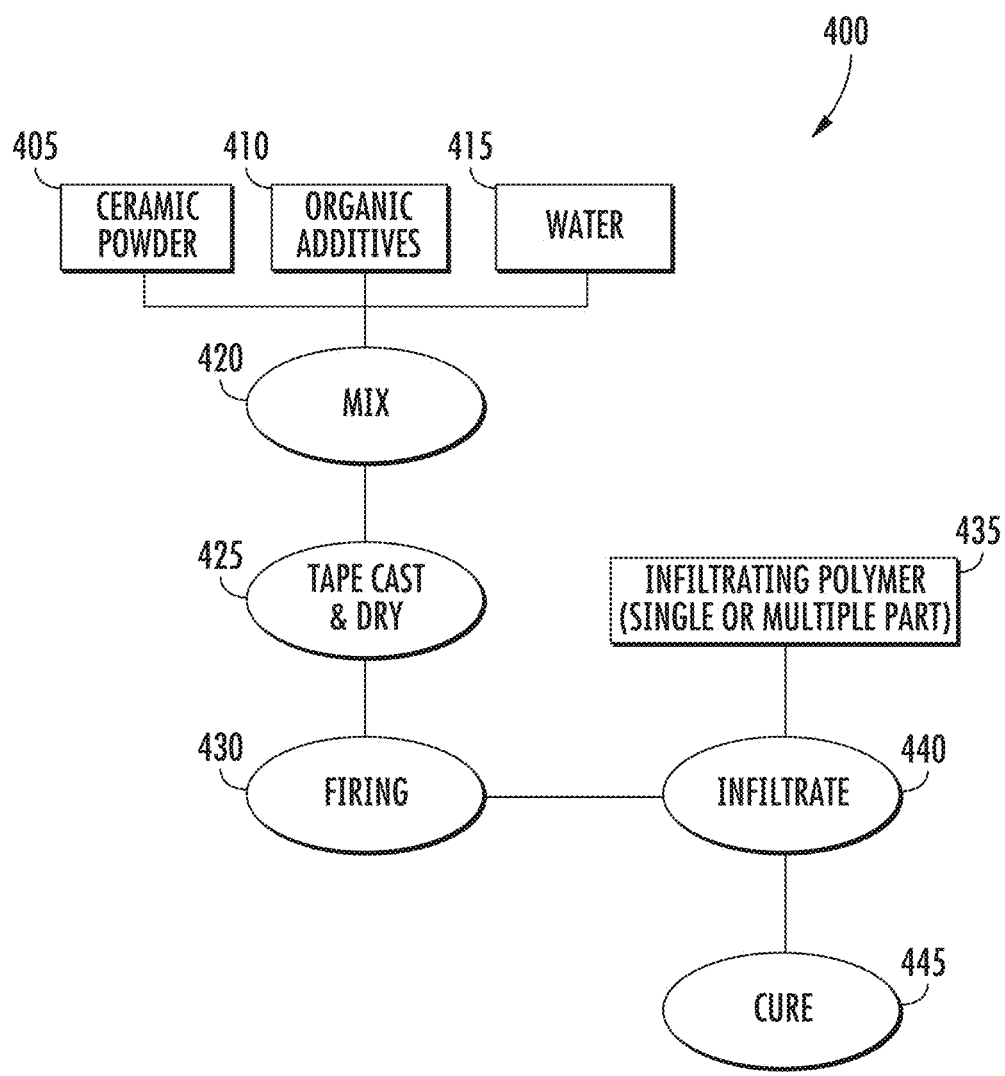
FIG. 4 shows a flow chart summary of a method of making the disclosed ceramic-polymer composite.

FIG. 4 shows a flow chart summary of a method of making (400) the disclosed ceramic-polymer composite including, for example: combining a ceramic powder (405), one or more organic additives (410), and a suitable solvent (415) such as water; thoroughly mixing (420) the combined mixture; tape casting (425) the thoroughly mixed mixture to form a tape cast sheet; firing the tape cast sheet (430); infiltrating the tape cast sheet (435) with a one (e.g., self-curing) or two component polymer (e.g., polymer and cross-linking component) to form an infiltrated cast sheet (440); and curing the infiltrated polymer in the cast sheet (445) to afford the composite.

In embodiments, the disclosure provides a composite PCB that includes a co-continuous polymer and ceramic composite. The composite can be fabricated by, for example, forming a bisque fired ceramic tape and then infiltrating the resulting porosity in the ceramic tape with a selected resin.

In embodiments, the tape can be formed using a tape casting process, which can use, for example, an organic binder, an aqueous binder, or a mixture thereof, and an organic liquid, an aqueous liquid, or a mixture thereof. The liquid is preferably removed prior to bisque firing.

In embodiments, the resin can be applied to the surface of the tape and can wick into the pores of the tape. Capillary infiltration processes are known and interfacial engineering between the resin, tape substrate, and the surrounding atmosphere (e.g., composition, pressure, and temperature) are process parameters considered in the wicking process. In embodiments, examples include infiltrating an aluminum oxide tape with an amine-epoxide resin under standard ambient conditions (i.e., non-controlled). The process resulted in an isotropic material that is stiff and mechanically durable. In embodiments, a strength of from 125 and 150 MPa and a Young's modulus of from 50 and 65 GPa was measured for the isotropic material. In embodiments, the strength and Young's modulus can change as a function of the ceramic content.

In embodiments, the disclosed co-continuous ceramic-polymer composites are advantaged in several respects, for example:

the disclosed composites can enable technology that permits high frequency uses and thinner profiles within the electronics industry;

the disclosed composites can have dielectric properties and mechanical durability properties that can be comparable to or exceed FR4 or similar materials;

the disclosed composites can provide superior mechanical stiffness, material choice, and frequency dielectric performance;

the disclosed PCB article can have, for example: a low dielectric constant; a low dissipation factor; and adjustable mechanical properties; and the disclosure provides a method of making including imbibing a porous ceramic such as a tape, with a polymer and a polymer thermal- or radiation-cure step; and a thin form factor profile, for example, having a tape thickness of from 50 to 100 micrometers.

In embodiments, the disclosure provides a method of making the composites including, for example, a four-step sequence including: tape casting a ceramic tape from, for example, a slurry; firing the tape; impregnating the tape with curable liquid polymer or liquid resin; and curing the resin in situ to form the composite.

In embodiments, curing the resin in situ can be accomplished simultaneously such as with a self-curing resin, or sequentially such as exposure of a curable resin to heat or radiation.

In embodiment, the disclosure provides a selection of polymer systems that can be used to produce the disclosed co-continuous polymer-ceramic composite, which can have a low dissipation factor (e.g., Df less than 0.01 at 10 GHz) and that make the composite suitable for circuit board applications. In embodiment, the disclosed polymers can be, for example, infiltrated into the porous ceramic, and then cured by, for example, UV- or thermal methods. The polymer can be selected for properties such as dielectric properties, glass transition temperature (Tg), Young's modulus, chemical durability, or a combination thereof. The resulting structure is superior in at least these properties compared to commercially available resin/glass-fiber boards. The polymer selection can include, for example, a modification of a particular polymer molecular weight, crosslink density, formulation, or by changing the polymer structure and type (see, for example, isola-group.com, an industrial leader in products for PCB).

Ceramics have been made with porosities of from 99% to 1%. For integrated circuit board (ICB) applications, there are material advantages to use ceramics with porosities that range from 60% and 99%. For the specific ICB application and durability function, preferred ceramic substrates can have an internal void space or a porosity of from 50% to 90 vol %.

The ceramic material can be selected based on the inherent properties of the material. Alumina was selected for ICB applications because of its dielectric properties and its high stiffness. Other materials can be selected, for example, silica can be chosen for it superior dielectric properties if stiffness is less important. Aluminum nitride can be used if thermal conductivity is important and dielectric properties can be sacrificed.

The polymer can also be varied based on properties desired in the composite article. An ICB calls for the polymer to have low dielectric loss. Low temperature curing polymers and UV curable polymer are advantageous in the ICB application for processing reasons.

In embodiments, the disclosure provides several polymer systems that are representative and that can be selected for the co-continuous polymer phase of the polymer-composite that will result in a dissipation factor (Df) of less than 0.01. Table 1 lists examples of several representative alumina substrates and a reference substrate used to prepare composites.

TABLE 1

Representative alumina substrates.

| Attribute | Reference substrate NIST Al$_2$O$_3$ control | Properties of inventive substrates Substrate ID | | | | | |
|---|---|---|---|---|---|---|---|
| | | A1 | A2 | A3 | A4 | A5 | A6 |
| Firing Temp (° C.) | | 1100 | 1200 | 1225 | 1250 | 1275 | 1300 |
| Porosity (%) | <1 [1, 2, 3] | 44 | 41 | 29 | 25 | 21 | 17 |
| Dielectric Constant | 9.94 [3] | 5.4 | | | | | |
| Loss Tangent | 0.00012 [3] | 0.006 | | | | | |
| Flexure Modulus (GPa) | 396 [1] | 34 | 43 | 110 | 138 | 175 | 210 |
| Fracture Strength (MPa) | 522 | 155 ± 21 | | 245 ± 93 | 372 ± 140 | 610 ± 105 | 490 ± 113 |
| No. of Samples for Strength[4] | | 4 | | 5 | 5 | 5 | 4 |

[1] Database Table # 901 *Elastic Moduli Data for Polycrystalline Ceramics*, R. G. Munro, NISTIR 6853, (2002), National Institute of Standards and Technology, Gaithersburg, Maryland 20899.
[2] NIST Citation # Z00614 "Evaluation of Fracture Strength of Porous Alumina Sintered by Hot Isostatic Pressing (HIPing)," Y. Kinemuchi, N. Fusamune, A. Takata, and K. Ishizaki, *Journal of the Ceramic Society of Japan*, Vol. 106 [4], pp. 435-440 (1998), published by Ceramic Society of Japan.
[3] NIST Technical Note 1520 "Dielectric and Conductor-Loss Characterization and Measurements on Electric Packaging Materials," J. Baker-Jarvis, M. D. Janezic, B. Riddle, C. L. Holloway, N. G. Paulter, I. E. Blendell, NIST Technical Note 1520 (2001) (nvlpubs.nist.gov/nistpubs/Legacy/TN/nbstechnicalnote1520.pdf)
[4]Number of samples used for strength testing measurements.

Table 2 lists examples of several representative polymer systems for preparing the co-continuous polymer phase in the comparative and the disclosed composites.

(Erysis GE22 from Emerald Performance Materials). The dissipation factor (Df) achieved in the disclosed PCB having this polymer was 0.013.

TABLE 2

Representative polymers for the co-continuous polymer phase.

| Polymer | Component A | Wt % | Component B | Wt % | Curing Schedule Heating Rate \| Target Temp \| Dwell Time \| Atmosphere |
|---|---|---|---|---|---|
| BT[1] Comparative Control - a 2 part BT Epoxy resin US 6,509,414 | — | — | — | — | Not reported \| 180° C. \| 2 hrs \| $N_2$<br>Not reported \| 200° C. \| 8 hrs \| $N_2$<br>Not reported \| 220° C. \| 5 hrs \| $N_2$<br>Not reported \| 171° C.[3] \| 1 hrs \| Air<br>Not reported \| 200° C. \| 2 hrs \| Air |
| Amicure PACM/Erisys GE22 a 2 part epoxy amine | Amicure PACM | 25 | Erisys GE22 | 75 | 120° C./min \| 100° C. \| 2 hrs \| $N_2$<br>120° C./min \| 150° C. \| 2 hrs \| $N_2$ |
| ELAN-Cast® E500/C46 a 2 part BPA epoxy resin | C46 | 33 | E500 | 67 | 120° C./min \| 75° C. \| 12 hrs \| Air |
| Epoxylite® 6107 a 2 part BPF epoxy resin | 6107 Hardener | 50 | 6107 Resin | 50 | 100° C./min \| 121° C. \| 3 hrs \| $N_2$<br>100° C./min \| 135° C. \| 3 hrs \| $N_2$<br>100° C./min \| 220° C. \| 3 hrs \| $N_2$ |
| IA-DA[2] a 1 part UV curable acrylate | IA-DA | 100 | | | 9.6 J/cm² (1.2 J/cm² per pass, 8 passes) @ 225-400 nm and 1400 kPa pressure |
| Rexolite® 12517 a 1 part crosslinkable polystyrene | Rexolite® 12517 | 100 | | | 100° C./min \| 80° C. \| 2 hrs \| Air |

[1]H-J., Hwang, et al., *Polymer*, 47 (2006) 1291-1299.
[2]Bismaleimide triazine (BT) resin: a copolymer of a bismaleimide monomer and a cyanate ester that is crosslinked with a triazine (see, for example, US5886134). The bismaleimide triazine (BT) type resins can have a structure shown, for example, in equation (11). The identity of the resin in this product is not known for certain. IA-DA 16076-68-2 is an experimental UV curable coating including about 74.62 wt % isobornyl acrylate (IA), about 24.87 wt % dicyclopentyl acrylate (DA), and about 0.5 wt % TPO (i.e., Irgacure® TPO photoinitiator available from BASF).

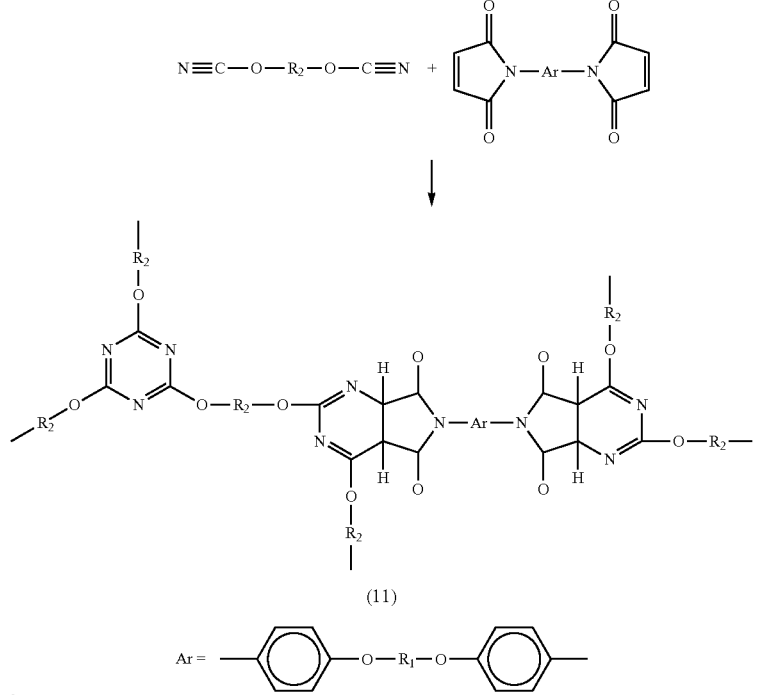

(11)

[3]Fusion Systems UV curing apparatus with a 600 W/in D-bulb radiation source (50% power and approximately 12 ft/min belt speed) and dose measured with a Light Bug model IL490 (International Light) radiation source.

In embodiments, the polymer selected for the composite was, for example, a thermally cured epoxy/amine polymer, such as where the amine was 4,4'-methylenebiscyclohexanamine resin (Amicure PACM from Air Products) that was mixed with 1,4-cyclohexanedimethanol diglycidyl ether Hardeners or Crosslinkers Examples include an isocyanate, a phenol, a dicarboxylic acid or anhydride, an acrylate, a styrene or a polystyrene, a polyimide, a polyamine, wherein the crosslinker is selected from the group consisting of: a glycidyl ether, e.g., a Bisphenol A diglycidyl ether of the formula:

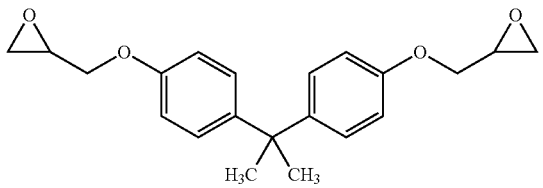 [SMILES: CC(C)(c1ccc(OCC2CO2)cc1)c1ccc(OCC2CO2)cc1]

a difunctional acrylate, a difunctional vinyl monomer, a difunctional hardener for an epoxy resin selected from an amine, an acid, an acid anhydride, a phenol, an alcohol, a thiol, and mixtures thereof.

In embodiments, formaldehyde can be a crosslinker for a phenolic resin; a polyol can be a crosslinker for an isocyanate resin, an alkyd resin, or a mixture thereof.

In embodiments, the disclosure provides a porous alumina substrate having a thickness of, for example, from 80 and 90 micrometers that was infiltrated with one or more of the disclosed polymer systems. The porosity of the ceramic was of from 40 and 50 vol % (volume percent). Table 3 lists the results and properties of exemplary disclosed co-continuous polymer-ceramic composites and a comparative composite material prepared with a commercial BT epoxy resin.

In embodiments, the disclosed polymers suitable for the composite can preferably have a viscosity that permits complete infiltration into the porous ceramic. The viscosity of these liquid polymers or solution polymers at 25° C. can be, for example, from 0.6 cP to 2000 cP. It is known in the polymer art that an increase in temperature can lower the viscosity of the polymer and elevated temperatures can optionally be used advantageously during infiltration. The resulting imbibed or infiltrated polymer in the porous ceramic can be cured in-situ by, for example, thermally or by actinic radiation, such as by UV radiation.

In embodiments, the disclosed polymers can include, for example, Elan-Cast® (e.g., E 500 Resin and C-46 Hardener, a two component epoxy potting compound), and Epoxylite® (e.g., E 6107 Hi Temp a two component epoxy impregnating resin), which are thermally curable and commercially available from Elantas PDG (see elantas.com).

Tape casting is known in advanced ceramics and is scalable to form large thin sheets having a thickness of from 1 millimeter to 50 micrometers or less. Most ceramic, metal, and polymer materials can be tape casted permitting for a large number of substrate (tape) composition choices.

In embodiments, the stiffness of the ceramic skeleton can depend on the amount of sintering that occurred and the inherent stiffness of the tape casted material. The stiffness is isotropic so all dimensions will have similar properties. Without the use of pore formers, the bisque fired ceramics can have a full density of from 40% to 99%.

TABLE 3

Properties of exemplary co-continuous polymer-ceramic composites.

| | Comparative composite | Properties of inventive composites | | | | | |
|---|---|---|---|---|---|---|---|
| | | Substrate ID | | | | | |
| Attribute | Isola FR408HR[1.] | A1 | A2 | A3 | A4 | A5 | A6 |
| Firing Temp. (C.) | | 1100 | 1225 | 1250 | 1275 | 1100 | 1300 |
| Polymer | See Note[1.] | Epoxylite ® 6107 | Epoxylite ® 6107 | Epoxylite ® 6107 | Epoxylite ® 6107 | ElanCast ® E500/C45 | ElanCast ® E500/C45 |
| Dielectric Constant 10 GHz | 3.65 | 2.84 | | 6.66 | | 2.4 | 4.1 |
| Loss Tangent 10 GHz | 0.0095 | —[2.] | | 0.0046 | | 0.0060 | 0.0016 |
| Flexure Modulus | 25.5 GPa Grain direction 22.8 GPa Fill direction | 101 GPa | 127 GPa | 152 GPa | 162 GPa | 50 GPa | 251 GPa |
| Fracture Strength | 500 MPa Lengthwise 400 MPa Crosswise | 238 ± 40 MPa | 298 ± 58 MPa | 388 ± 102 MPa | 302 ± 197 MPa | 276 MPa | 475 |
| $T_d$ @ 5% loss | 360 | 413 | | 483 | | 385 | |

[1.]Isola Resin Note: The identity of the resin in this product is proprietary. However, Isola has several patents for epoxy based resins, see U.S. Pat. Nos. 6,509,414 and 8,022,140 (see also: isola-group.com).
[2.]An erroneous result, that differed by an order of magnitude from the expected loss tangent, is under review.

In embodiments, the present disclosure provides a co-continuous composite having, for example, approximately a 55 volume percent aluminum oxide and 45 volume percent epoxy. The stiffness of the composite was approximately 60 GPa giving a rigidity figure of merit value of 938 N*mm and allowing a thickness reduction to 180 micrometers while maintaining the same rigidity of a 250 micrometer FR-4 material (see the above mentioned commonly owned and assigned U.S. Pat. No. 9,287,106, entitled "Translucent alumina filaments and tape cast methods for making," which mentions translucent alumina substrates and tape casting).

Certain commercially available polymer-ceramic composites are made of glass fibers drawn using the viscoelastic properties of the glass. Expansion of current technologies into alternative ceramic materials as a replacement to glass may use expensive ceramic fiber forming methods. The glass fibers are currently woven into planer fiber mats, which are then stacked to proper thickness.

The disclosed inventive materials and processes do not use the abovementioned expensive three dimensional weaves, which would provide quasi-isotropic properties resulting in thickness properties that differ from the planer properties.

In embodiments, the disclosed method of making calls for a porous ceramic to be infiltrated with a resin and then curing the resin. Certain commercially available polymer-ceramic composites can use, for example, of from 50 and 70 volume percent resin to fill the space between the fiber tows. In contrast, the disclosed bisque fired ceramic can have of from 10 and 50 volume percent resin, which provides a higher ceramic content composite compared to the current technology. Higher ceramic content and lower resin content results in increased structural stability.

In embodiments, the disclosed composites have higher inorganic content and an isotropic structure that results in higher frequency dielectric capability and higher frequency performance.

A ceramic composite can be functionally engineered to target the requirements of PCB applications. A stiff ceramic skeleton can be used to create stiffness and dimensional stability where a resilient polymer network creates a high toughness phase. Within a co-continuous composite, the ceramic creates the rigidity and the polymer stops cracks that may occur when the ceramic begins to fail. These structural features synergistically create a rigid and tough material that has mechanical properties that are intermediate between a ceramic and a polymer.

EXAMPLES

The following Examples demonstrate making, use, and analysis of the disclosed composites and methods in accordance with the above general procedures.

Example 1

Preparation of porous alumina substrate A porous alumina ceramic substrate, having an area of 3×4 inches, a thickness of from 80 and 90 micrometers, and a porosity of from 50 and 60 volume percent, was prepared as follows.

A substrate, such as tape casted, translucent alumina filament or plate precursor can be prepared by a general method including, for example:

attrition milling a batch mixture comprising an alumina (i.e., ceramic) powder having a mean particle size of from 50 to 500 nanometers, a binder, a dispersant, a plasticizer, a defoaming agent (i.e., organic additives), and an aqueous or non-aqueous solvent (e.g., water) for, for example, from 10 min to 10 hrs to form a slurry;

optionally degasing the resulting slurry under vacuum;

tape casting the degased slurry to a wet thickness of from 20 to 2,000 micrometers;

controlled drying using, for example, an under-bed heater and heated flowing air at from 20 to 100° C. of the tape casted slurry to form a green tape having a dry thickness of, for example, from 5 to 1,000 micrometers; and firing the green tape for a sufficient time and sufficient temperature to provide a sintered translucent alumina filament or plate precursor.

Typical slurry ingredients and their amounts (vol % and wt %) are listed in Table 4.

TABLE 4

Slurry ingredients and amounts.

| Component | Vol % | Wt % |
|---|---|---|
| Water | 47.80 | 28.80 |
| WB4101 binder (Source: Polymer innovations) | 26.07 | 16.18 |
| DS001 dispersant (Polymer innovations) | 1.85 | 1.15 |
| NH$_4$OH | 2.00 | 1.20 |
| DF002 defoamer (Polymer innovations) | 0.31 | 0.22 |
| Al$_2$O$_3$ | 21.98 | 52.44 |
| Total | 100 | 100 |

In embodiments, a substrate, such as tape casted, translucent alumina can be prepared by either an aqueous- or non-aqueous based tape-casting methods comprising, for example: as described in the abovementioned commonly owned U.S. Provisional Application No. 62/019,649, now U.S. Pat Pub 20160002117. Additionally, general concepts and principles related to tape casting are mentioned in "Principles of Ceramic Processing" by James S. Reed, 1995, 2nd Ed., ISBN-13: 978-0471597216. U.S. Pat Pub 20160002117 mentions a tape casting process for translucent alumina substrates and provides a process flow chart in FIG. 2 therein. The alumina powder is mixed in a water-based tape casting system, optionally including a binder, a dispersant, a plasticizer, and a defoaming agent. Alternatively, a solvent-based tape casting system can be used, where the translucent alumina tapes can be made with an alcohol such as ethanol, methanol, propanol, butanol, a ketone, such as methyl ethyl ketone, benzene, toluene, and like solvents. One example, mentions an ethanol-based solvent system and a polyvinyl butyral binder. Other non-aqueous systems include, for example, polypropylene carbonate (PPC) binders with carbonate solvents such as dimethyl carbonate or diethyl carbonate, and acrylic binders, which can unzip or depolymerize rather than combust.

The batched materials can be mixed and milled, for example, by one or more of ball milling, high shear mixing, attrition milling, vibratory milling, roller milling, and like methods. The milling process is a significant step that preferably should provide fully de-agglomerated particles and create a uniform, i.e., a well dispersed, slurry. In embodiments, an attrition mill (aka., stirred ball mill), is excellent for achieving de-agglomeration of the alumina powder. The attrition mill has benefits over other milling processes and equipment due to the high energy input to the materials during the milling process. This allows a batch to be milled to smaller particle sizes in a shorter period of time compared to other techniques, for example, in 1 to 3 hrs versus 50 to 100 hrs with ball milling. In embodiments, this leads to a more homogenous microstructure in the tape.

The particle size of the alumina powder can be selected for the desired application and constraints. In embodiments, the alumina powder can have a mean particle size of from 50 to 1000 nanometers. In embodiments, the alumina powder, prior to introduction into the slurry, can have, for example, a BET surface area of from 2 to 30 m$^2$/g. In embodiments, the alumina powder can have, for example, a ceramic solids loading in the slurry of from 5 to 60 vol %, and the green tape can have, for example, a ceramic solids loading of from 35 to 85 vol %.

In embodiments, the milling process can be accomplished, for example, at a controlled temperature, such as 0, 5, 10, or 15° C., to avoid overheating and reduce evaporation of solvent(s). In embodiments, the slurry can be initially milled for a short period of time (e.g., about 5 to 20 mins) at low rpm (e.g., about 4 to 600 rpm) to break down large agglomerates, then the rpm can be increased to about 1000 to 1500 rpm and milled, for example, for 30 mins to two hours.

When the alumina has been sufficiently milled, the milling media is strained through a mesh screen (e.g., 80 to 120) from the slurry, and the slurry is de-aired/degased using a vacuum. This removes entrapped air from the milled product that would otherwise be seen as bubbles within the mixture. For example, de-airing can be accomplished with a desiccator chamber and then a vacuum planetary mixer. In such an example, the slurry is loaded into a desiccator chamber and de-aired for up to 10 mins. After the initial de-airing, the slurry was loaded into the planetary mixer and operated under vacuum. An alternative de-airing procedure can use a higher vacuum in the desiccator chamber.

When the degasing process is completed, the slurry can optionally be filtered to remove any large scale contamination from the mixture that would otherwise impart adverse properties in the sintered material. Filtering can be accomplished with, for example, 100, 50, 25, 10, or 1 micrometer filters made of, for example, nylon, fiber, or other suitable materials.

Next, the slurry is tape cast using a doctor blade or other casting setup, at a desired thickness to form a wet, thin sheet of ceramic slurry. The wet thickness of the slurry can be from about 20 to about 20,000 micrometers. Casting is preferably accomplished under clean room conditions, such as a class 100 or class 1000 clean room, to avoid contamination of the alumina. Other steps, such as the milling, de-airing, and lamination steps, can also be done in a clean room to further reduce the contamination levels. In embodiments, the samples were tape cast on a silicone-coated Mylar® film that was approximately 50 to 500 micrometers thick. The silicone coating provides easy release of the tape material after drying. Other suitable films or surfaces for the tape can be, for example, Teflon®, glass, a metal belt, and like alternative materials. The slurry was passed under a doctor blade which had a gap of about 100 to 1000 micrometers, to form a thin sheet of ceramic tape. The casting blade was moved across the Mylar® at, for example, a speed of 10 mm/sec. The speed can be varied as needed to increase process speed, and modify the thickness of the tape. The wet tape is dried under controlled conditions to form a thin ceramic/polymer composite tape, referred to as a tape in the "green state" or alternatively "green tape", which can be formed to the desired shape.

In embodiments, the tape is dried under controlled constraints, for example, using an under-bed heater and flowing heated air at, for example, from 20 to 100° C. over the tape for a time sufficient to dry the tape to the desired level. Generally, the translucent alumina substrate and substrate precursor are insensitive to slight variations in either the amount of the binder in the tape cast slurry or the amount of the porosity. In embodiments, the green tape can preferably have a porosity of from about 0.01 to about 25 vol %. In embodiments, the green tape ceramic solids loading can be, for example, greater than 45 vol %, e.g., 45, 50, 60, or 70 vol % or greater.

Firing The green tape or dried green tape was fired using a single thermal cycle which included going through the binder burnout and sintering steps in a single furnace. The tape part was heated to a sintering temperature between 1100 and 1300° C. and held for from 2 to 10 hrs. The amount of porosity within the substrate is related to the heating cycle utilized.

Example 2

Preparation of imbibed porous alumina substrate: UV curable acrylate The porous alumina ceramic substrate of Example 1, was infiltrated with a UV curable one part acrylate IA-DA including about 74.62 wt % isobornyl acrylate (IA), about 24.87 wt % dicyclopentyl acrylate (DA), and about 0.5 wt % TPO (i.e., Irgacure® TPO photoinitiator available from BASF). The infiltrated polymer was cured under nitrogen purge with a Fusion Systems UV curing apparatus with a 600 W/in D-bulb radiation source (50% Power and approximately 12 ft/min belt speed) with a total dose of 9.6 J/cm$^2$ (1.2 J/cm$^2$ per pass, 8 passes) at 225 to 400 nm as measured with a Light Bug model IL490 (International Light).

Example 3

Preparation of imbibed porous alumina substrate: Two-part Epoxy The porous alumina ceramic substrate of Example 1, having a thickness of from 80 and 90 micrometers and a porosity of from 50 and 60 volume percent, was infiltrated with a 1:1 mol equivalent ratio mixture of 4,4'-methylenebiscyclohexanamine resin and 1,4-cyclohexanedimethanol diglycidyl ether at ambient temperature by pouring the mixture on the top surface of the substrate and spreading with a spatula until the top surface is fully covered with the mixture. Alternatively or additionally, if there is an excess of the mixture it can be wiped away from the surface of the substrate. Alternatively or additionally, the mixture can be controllably deposited on the surface of the substrate with a slot die coater and can avoid removal of residual or excess mixture from the top surface. The resulting coated substrate was allowed to stand at ambient temperature, for example, for about 1 min to permit complete or near complete infiltration and until there was no change in the appearance of the amount of polymer on the surface, e.g., a visible thin film, if any. The resulting coated and infiltrated substrate was thermally cured by heating the material to 100° C., allowing it to dwell for 120 minutes, then heated to 150° C. and allowed to dwell for 120 minutes within an nitrogen atmosphere. An alternative two part epoxy resin that can be used in place of the above two-part Epoxy of Example 3 is, for example, ElanCast or Epoxylite, but either of these may involve a different curing schedule.

The disclosure has been described with reference to various specific embodiments and techniques. However, it should be understood that many variations and modifications are possible while remaining within the scope of the disclosure.

What is claimed:

1. A printed circuit board comprising a ceramic and polymer composite comprising:
   a first continuous phase comprising a sintered porous ceramic having a solid volume of from 50 to 85 vol % and a porosity of from 50 to 15 vol %, based on the total volume of the composite; and
   a second continuous polymer phase situated in the porosity of the sintered porous ceramic first continuous phase,
   wherein the composite is a sheet having a thickness of from 10 to 100 micrometers;

wherein the printed circuit board has a frequency dielectric constant of from 2.4 to 6.7 at 10 GHz.

2. The printed circuit board of claim 1 wherein the sintered porous ceramic comprises at least one of aluminum oxide, silicon oxide, or mixtures thereof.

3. The printed circuit board of claim 1 wherein the composite has a fracture strength of from 125 and 250 MPa, and a Young's modulus of from 50 and 250 GPa.

4. The printed circuit board of claim 1 wherein the Young's modulus of the sintered porous ceramic continuous phase is from 50 to 210 GPa.

5. The printed circuit board of claim 1 wherein the composite has a stiffness of from 50 to 65 GPa.

6. The printed circuit board of claim 1 wherein the composite has a coefficient of thermal expansion (CTE) of from $11 \times 10^{-6}$ $K^{-1}$ to $25 \times 10^{-6}$ $K^{-1}$ in each of the x, y, and z axes.

7. The printed circuit board of claim 1 wherein the sintered porous ceramic continuous phase has an overlapping sphere structure comprised of a plurality of partially fused adjacent spherical ceramic particles of at least one of aluminum oxide, silicon oxide, or mixtures thereof.

8. The printed circuit board of claim 1 wherein the sintered porous ceramic continuous phase is non-woven.

9. The printed circuit board of claim 1 further comprising at least one of:
- at least one machined surface;
- at least one hole drilled partially into the printed circuit board;
- at least one hole drilled through the printed circuit board, or combinations thereof.

10. A ceramic and polymer composite comprising:
- a first continuous phase comprising a sintered porous ceramic having a solid volume of from 50 to 85 vol % and a porosity of from 50 to 15 vol %, based on the total volume of the composite; and
- a second continuous polymer phase situated in the porosity of the sintered porous ceramic first continuous phase, wherein the composite has:
- a Young's modulus of from 50 to 250 GPa; and
- a coefficient of thermal expansion (CTE) of from $11 \times 10^{-6}$ $K^{-1}$ to $25 \times 10^{-6}$ $K^{-1}$ in each of the x, y, and z axes.

* * * * *

UNITED STATES PATENT AND TRADEMARK OFFICE
CERTIFICATE OF CORRECTION

PATENT NO. : 10,568,205 B2
APPLICATION NO. : 15/656657
DATED : February 18, 2020
INVENTOR(S) : Miao et al.

It is certified that error appears in the above-identified patent and that said Letters Patent is hereby corrected as shown below:

On the Title Page

In Column 2, item (56), U.S. Patent Documents, Line 12, delete "Mia" and insert -- Miao --, therefor.

In Column 2, item (56), Other Publications, Line 12, delete "Nonmaterials," and insert -- Nanomaterials, --, therefor.

On page 2, in Column 1, item (56), Other Publications, Line 8, delete "Proccessing," and insert -- Processing, --, therefor.

Signed and Sealed this
Tenth Day of May, 2022

Katherine Kelly Vidal
*Director of the United States Patent and Trademark Office*